(12) United States Patent
Wang et al.

(10) Patent No.: US 11,398,369 B2
(45) Date of Patent: Jul. 26, 2022

(54) METHOD AND APPARATUS FOR ACTIVELY TUNING A PLASMA POWER SOURCE

(71) Applicant: Applied Materials, Inc., Santa Clara, CA (US)

(72) Inventors: Rongping Wang, Cupertino, CA (US); Siamak Salimian, Santa Clara, CA (US); Tom K. Cho, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 268 days.

(21) Appl. No.: 16/452,266

(22) Filed: Jun. 25, 2019

(65) Prior Publication Data
US 2020/0411288 A1    Dec. 31, 2020

(51) Int. Cl.
| | |
|---|---|
| *H01L 21/306* | (2006.01) |
| *C23C 16/00* | (2006.01) |
| *H01J 37/32* | (2006.01) |

(52) U.S. Cl.
CPC .... *H01J 37/32183* (2013.01); *H01J 37/3244* (2013.01); *H01J 37/3299* (2013.01);
(Continued)

(58) Field of Classification Search
CPC .......... H01J 37/32183; H01J 37/32917; H01J 37/32926; H01J 37/32935; H01J 37/32944; H01J 37/3299
See application file for complete search history.

(56) References Cited

U.S. PATENT DOCUMENTS

| | | | | |
|---|---|---|---|---|
| 4,615,761 A | * | 10/1986 | Tada ...................... | G01N 21/62 156/345.25 |
| 5,198,072 A | * | 3/1993 | Gabriel ............. | H01J 37/32935 156/345.25 |

(Continued)

FOREIGN PATENT DOCUMENTS

| | | | |
|---|---|---|---|
| CN | 107070228 | * | 8/2017 |
| JP | 11-505661 A | | 5/1999 |

(Continued)

OTHER PUBLICATIONS

PCT/US2020/038427, International Search Report and Written Opinion dated Oct. 14, 2020, 10 pages.

*Primary Examiner* — Luz L Alejandro Mulero
(74) *Attorney, Agent, or Firm* — Patterson + Sheridan, LLP (57) ABSTRACT

An RF plasma generator configured to ignite and maintain a plasma from one or more processing gases is disclosed. A switch mode power supply is configured to convert a DC voltage from a DC power source to an RF voltage. A resonance circuit is configured to deliver an amount of power to an ignited plasma from the switch mode power supply. A plasma controller is configured to operate the power supply to apply an RF voltage corresponding to the amount of power to the one or more processing gases through the resonance circuit. The RF voltage increases in amplitude and decreases in frequency until the one or more processing gasses are ignited into a plasma. Responsive to detecting ignition of the plasma, the plasma controller is further configured to continuously adjust the frequency of the switch mode power supply to deliver the amount of power to the ignited plasma. The amount of power is a substantially constant amount of power.

20 Claims, 8 Drawing Sheets

(52) U.S. Cl.
CPC .. *H01J 37/32917* (2013.01); *H01J 37/32926* (2013.01); *H01J 37/32935* (2013.01); *H01J 37/32944* (2013.01); *H01J 2237/3341* (2013.01)

(56) References Cited

U.S. PATENT DOCUMENTS

| | | | |
|---|---|---|---|
| 5,236,556 A * | 8/1993 | Yokota | H01J 37/32963 204/298.32 |
| 5,449,410 A | 9/1995 | Chang et al. | |
| 5,578,161 A * | 11/1996 | Auda | H01J 37/32935 156/345.25 |
| 5,688,357 A | 11/1997 | Hanawa | |
| 5,738,756 A * | 4/1998 | Liu | H01J 37/32963 216/60 |
| 5,982,099 A * | 11/1999 | Barnes | H05H 1/36 315/111.21 |
| 6,291,999 B1 * | 9/2001 | Nishimori | H01J 37/32174 324/464 |
| 6,433,553 B1 * | 8/2002 | Goeckner | H01J 37/32935 324/464 |
| 6,887,339 B1 | 5/2005 | Goodman et al. | |
| 2010/0141221 A1 * | 6/2010 | Ilic | H01J 37/32935 323/234 |
| 2015/0024515 A1 * | 1/2015 | Hoffman | H01J 37/32706 438/5 |
| 2015/0319834 A1 * | 11/2015 | Liechti | H05H 1/0081 315/111.41 |
| 2016/0066404 A1 * | 3/2016 | Habu | H05H 1/36 315/223 |
| 2016/0293431 A1 * | 10/2016 | Sriraman | C23C 16/45561 |

FOREIGN PATENT DOCUMENTS

| | | |
|---|---|---|
| KR | 1020060094467 A | 8/2006 |
| WO | 2008/054391 A1 | 5/2008 |

* cited by examiner

METHOD AND APPARATUS FOR ACTIVELY TUNING A PLASMA POWER SOURCE

BACKGROUND

Field

Embodiments of the present invention generally relate to RF supplies and to semiconductor processing equipment. More specifically, aspects of the disclosure relate to RF supplies for generating RF plasmas in plasma processing chambers.

Description of the Related Art

Radio Frequency (RF) supplies (hereafter "RE power supplies") are widely used in semiconductor and industrial plasma processing equipment to generate plasmas in a process chamber. Plasma processing is used for a wide variety of applications, including etching of materials from substrates, deposition of materials on to substrates, cleaning of substrate surfaces, and modification of substrate surfaces.

Semiconductor processing chambers that employ plasma that is ignited and controlled to a high degree have several distinct advantages. In plasma striking scenarios, cutting/etching efficiency can be increased by measureable amounts if plasma is ignited and controlled within specified ranges of parameters. In processes in the semiconductor field, etching and deposition may be accomplished by impinging ions and radicals in the plasma on a substrate to be processed that are closely controlled. As the plasma can efficiently remove materials in semiconductor processing, precise control of the plasma species is desired as substantial increases in efficiency can be achieved. Deviations (high or low) from a desired plasma content may result in under or over processing of the substrates. Plasma density, one parameter needed to be controlled, can affect the etch rate. Plasma density is a function of power coupled to the plasma formed, therefore higher plasma density rates yield higher removal/etching rates.

Prior art RF power supplies used in plasma sources for semiconductor processing chambers generally have expensive and complex power generation and delivery systems. These plasma sources require a precision RF power generator, a power delivery system, a matching network, and metrology (measuring) equipment. In addition, precision instrumentation is usually required to control the actual power reaching the plasma. The cost of these prior art RF power supplies can be a considerable fraction of the total system cost.

During the processing, plasma may cool or vary as the process continues, essentially varying the rate at which processing proceeds. Resonant frequency impedance of plasma loads, for example, may fluctuate during processing. The impedance can vary considerably in response to variations in gas recipe, plasma density, delivered RF power, pressure and other parameters. The RF supply can deliver power to the plasma in a number of different ways. This can include inductive coupling via an antenna structure, capacitive coupling, launching a wave, exciting a resonant cavity, etc. The RF supply generally requires proper matching to the load impedance.

Most prior art RF generators for plasma processing equipment is designed to have a standard fifty-ohm output impedance. A matching network is required because the load represented by the process chamber and the plasma can vary widely and rapidly, causing mismatches in impedance between the standard fifty-ohm output impedance of the RF generator and the input of the load. A mismatch in the impedance of the generator and the plasma source causes great stress on electronics devices in the RF generator and the matching network and can cause premature failure because of either electrical or thermal stress or both.

Consequently, the reliability of prior art RF generators and matching networks is relatively low and is considered to be below desired standards of the semiconductor industry. The relatively low reliability increases the total cost of ownership (COO) of the plasma processing tool, since time must be spent in diagnosing failures and repairing or replacing defective RF equipment. Impedance mismatch also causes the power delivered to the plasma to vary, which can cause process inconsistency both within a chamber for successive substrates and among similar chambers.

There is a need, therefore, to keep resonant frequency impedance matched to the expected yields of the process. If a mismatch in impedance occurs, then full etching capabilities may be lost as power is reflected back from the needed process areas. Circuitry, therefore, is needed to compensate for impedance mismatching such that processing continues at desired rates.

In conventional applications, plasma is merely sought to be ignited, and the control processes used are relatively low in technology. Efficient use of power is generally not achieved and as a result, reliable and consistent ignition can be a problem. Such ignition problems limit the use of plasma to technology fields that do not require high precision of consistent and repetitive ignition.

Thus, there is a further need to provide for ignition of plasma that is consistent and able to be repetitively performed for various processes. There is also a need to provide a method for controlling plasmas that have been generated to allow for efficient use of the plasma during constantly varying reactor conditions.

SUMMARY

In one embodiment, an RF plasma generator configured to ignite and maintain a plasma from one or more processing gases is disclosed. A switch mode power supply is configured to convert a DC voltage from a DC power source to an RF voltage. A resonance circuit is configured to deliver an amount of power to an ignited plasma from the switch mode power supply. A plasma controller is configured to operate the power supply to apply an RF voltage to the one or more processing gases through the resonance circuit. The RF voltage increases in amplitude and decreases in frequency until the one or more processing gasses are ignited into the plasma. Responsive to detecting ignition of the plasma, the plasma controller is further configured to continuously adjust the frequency of the switch mode power supply to deliver the amount of power to the ignited plasma. The amount of power is a substantially constant amount of power.

In one embodiment, a processing chamber is disclosed. The processing chamber includes a chamber body having an internal volume. A gas inlet is disposed through the chamber body used to provide one or more processing gases to the internal volume from a processing gas source in fluid communication therewith. An RF plasma generator is configured to ignite and maintain a processing plasma from the one or more processing gases. The RF plasma generator includes a switch mode power supply configured to convert a DC voltage from a DC power source to an RF voltage. A resonance circuit is configured to deliver an amount of power to an ignited plasma from the switch mode power supply. The RF plasma generator further includes a plasma controller configured to operate the power supply to apply an RF voltage to the one or more processing gases through the resonance circuit. The RF voltage increases in amplitude and decreases in frequency until the one or more processing gasses are ignited into the plasma. Responsive to detecting ignition of the plasma, the plasma controller is further configured to continuously adjust the frequency of the switch mode power supply to deliver the amount of power to the ignited plasma. The amount of power is a substantially constant amount of power.

In one embodiment, a method for operating an RF plasma generator configured to ignite and maintain a processing plasma from one or more processing gases is disclosed. The method includes converting, by a switch mode power supply, a DC voltage from a DC power source to an RF voltage. The method further includes delivering, by a resonance circuit, an amount of power to an ignited plasma from the switch mode power supply. The method further includes operating the switch mode power supply, by a plasma controller, to apply an RF voltage to the one or more processing gases through the resonance circuit. The RF voltage increases in amplitude and decreases in frequency until the one or more processing gasses are ignited into a plasma. Responsive to detecting ignition of the plasma, the plasma controller is further configured to continuously adjust the frequency of the switch mode power supply to deliver the amount of power to the ignited plasma. The amount of power is a substantially constant amount of power.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Some embodiments will now be described with reference to the figures. Like elements in the various figures will be referenced with like numbers for consistency. In the following description, numerous details are set forth to provide an understanding of various embodiments and/or features. It will be understood, however, by those skilled in the art that some embodiments may be practiced without many of these details and that numerous variations or modifications from the described embodiments are possible. As used herein, the terms "above" and "below", "up" and "down", "upper" and "lower", "upwardly" and "downwardly", and other like terms indicating relative positions above or below a given point or element are used in this description to more clearly describe certain embodiments.

Embodiments of the present disclosure provide an RF plasma generator. The RF plasma generator includes a variable frequency switch mode power supply. The RF plasma generator further includes a resonance circuit (matching network). The RF plasma generator further includes a plasma controller for operating the RF plasma generator. The resonance circuit includes a first port that is electromagnetically coupled to the output of the switch mode power supply and a second port. The second port of the resonance circuit is configured to be coupled a load that is electromagnetically coupled to plasma chamber for igniting and maintaining a plasma. To ignite the plasma in the plasma chamber, the RF generator ramps up an amplitude of an RF ignition voltage while decreasing a frequency of the RF ignition voltage until the plasma is ignited from one or more process gasses. Sensor circuitry coupled to the second port of the resonance circuit senses a resulting RF current and RF voltage and provides these signals to the plasma controller. The plasma controller receives and digitizes these signals, reconstructs the RF current and voltage waveforms in digital form, and then detects ignition of the plasma due to a sudden increase in current above a threshold and decrease in voltage below a threshold as a result of a drop in impedance of the ignited plasma. The RF generator then switches to a power delivery mode wherein the plasma controller continuously adjusts the frequency of the RF generator to compensate for a deviation of a substantially constant plasma maintaining power (set point) applied to the load due to fluctuations in plasma impedance. In one embodiment, to compensate for the deviation from the plasma maintaining power, the RF generator applies a frequency to cause the resonance circuit to match the impedance of the ignited plasma to maintain the plasma as a resistive load. The frequency of the RF generator changes the power in the plasma to a (maximum) constant power (set point) approximately equal to the power output by the RF generator.

The load of the RF plasma generator may be reactive. The resonance circuit may transform the impedance of the reactive load to a substantially real impedance. The load may comprise an inductive load. The load may comprise a capacitive load. Adjusting the frequency of the RF generator may increase/decrease the power delivered to the plasma.

The frequency of the RF generator may be adjusted in response to a measurement of the sensors. The frequency of the RF generator may be adjusted to minimize power reflected from the plasma. The frequency of the RF generator may be adjusted to maximize power in the plasma.

In embodiments, the RF generator may actively conduct a high voltage ramp-up at the start of a power on sequence which may be used to initiate the plasma field. The amount of voltage increase may be pre-programmed through associated circuitry in the plasma controller, to needed levels as well as over the discrete time periods necessary. In other embodiments, after ignition, the RF generator may switch into a constant power delivery mode that has closed loop and active load impedance tuning.

In the embodiments provided, the RF generator provides advantages over conventional power sources. The embodiments disclosed provide a more reliable and consistent ignition while lowering parasitic losses. Solid state control provides for precise power measurement capabilities compared to a conventional RF generator. Since power measurement capabilities are superior compared to conventional RF generators, plasma ignition failure is alleviated. Fast and accurate power control at RF levels in switching modes is provided.

In the embodiments disclosed, aspects of the disclosure have an actively controlled voltage source and plasma-on sensing. The sensing capability may also be configured to detect arcing as well. After plasma ignition, a closed-loop power control system, at resonant frequency levels, is initiated and measures the RF power to a reactive load. Conventional apparatus provide for open loop power control. In aspects of the disclosure, voltage produced by the RF generator is actively controlled in a ramp-up method to approach and achieve a level for successful ignition without voltage overshooting (going beyond voltage levels needed for ignition).

Embodiment are further intending to achieve more reliable and consistent ignition, higher efficient power delivery and lower parasitic loss, and more precise power measurement and closed loop control for the plasma especially for plasmas with low driving voltage and high current. Embodiment further address plasma ignition failure, and fast and accurate power control at RF level in switching mode plasma power supply.

Figure 1:
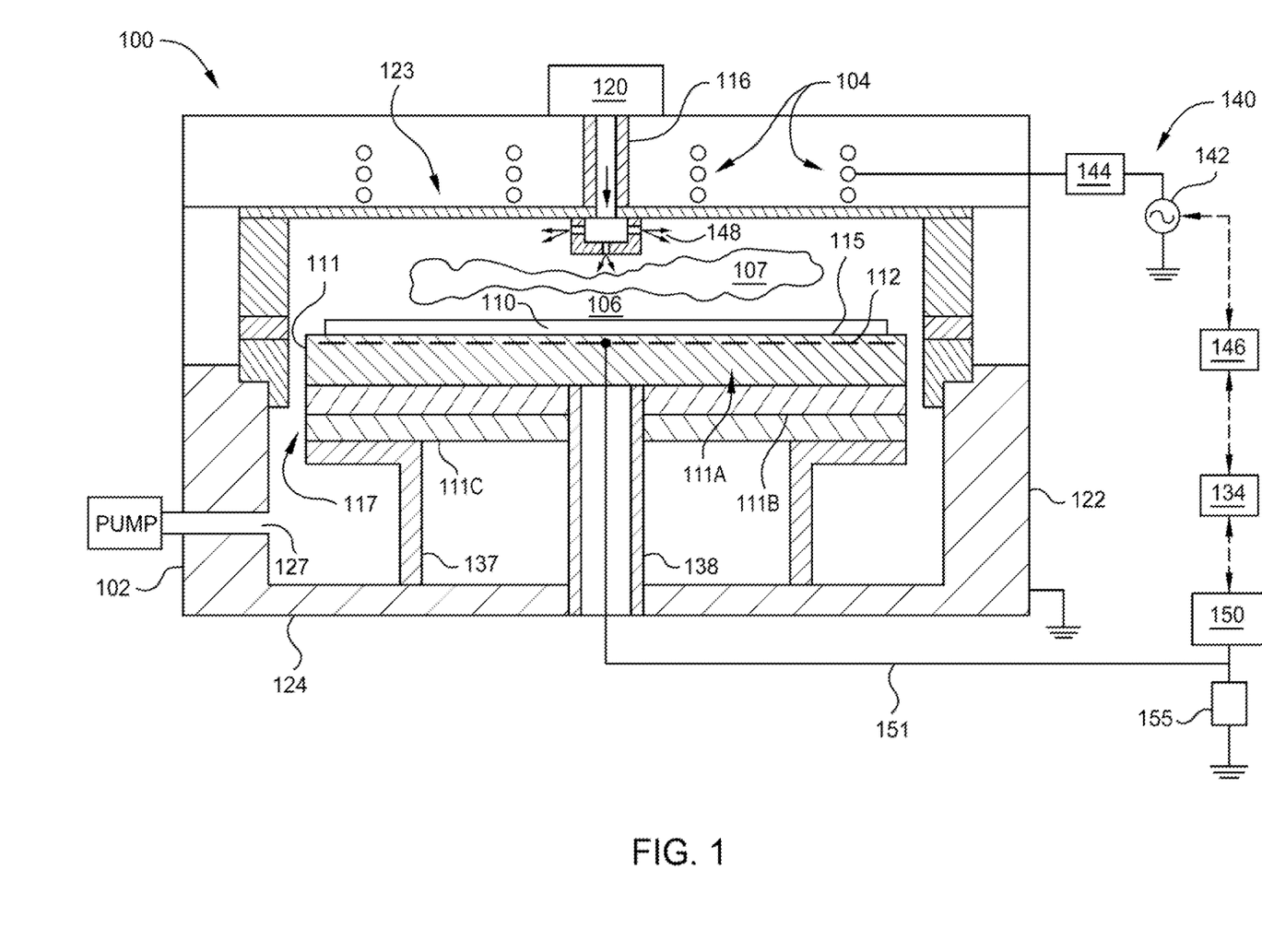
FIG. 1 is a schematic cross-sectional view of a processing chamber configured to perform a plasma process within a processing volume of the process chamber by use of a source assembly, according to one embodiment.

FIG. 1 is a schematic cross-sectional view of a processing chamber 100 configured to perform a plasma process within a processing volume 106 of the processing chamber 100 by use of a source assembly 140, according to one embodiment. In this embodiment, the processing chamber 100 is a plasma processing chamber, such as a reactive ion etch (RIE) plasma chamber. In some other embodiments, the processing chamber is a plasma-enhanced deposition chamber, for example a plasma-enhanced chemical vapor deposition (PECVD) chamber, a plasma enhanced physical vapor deposition (PEPVD) chamber, or a plasma-enhanced atomic layer deposition (PEALD) chamber. In some other embodiments, the processing chamber is a plasma treatment chamber, or a plasma based ion implant chamber, for example a plasma doping (PLAD) chamber. Herein, as shown in FIG. 1, the processing chamber 100 includes the source assembly 140 that includes an inductively coupled plasma (ICP) source electrically coupled to a radio frequency (RF) switch mode power supply 142 through a resonance circuit 144 (an RF matching circuit 144) under the control of a plasma controller 146. In other embodiments, the source assembly 140 is a capacitively coupled plasma (CCP) source, such as a source electrode (not shown) disposed in the processing volume 106 facing the substrate support 111, wherein the source electrode is electrically coupled to an RF power supply (not shown).

The processing chamber 100 includes a chamber body 102 which includes a chamber lid 123, one or more sidewalls 122, and a chamber bottom 124 which define a processing volume 106. A gas inlet 116 disposed through the chamber lid 123 is used to provide one or more processing gases 148 to the processing volume 106 from a processing gas source 120 in fluid communication therewith. Herein, a switch mode power supply 142 and a resonance circuit 144 are configured to ignite processing gases 148 into a plasma 107 under the control of the plasma controller 146. The processing chamber 100 further includes one or more inductive coils 104 disposed proximate to the chamber lid 123 outside of the processing volume 106. The switch mode power supply 142 and the resonance circuit 144 are used to ignite and maintain a plasma 107 using the processing gases 148 and electromagnetic field generated by the inductive coils 104 and switch mode power supply 142. The configuration of the switch mode power supply 142, the resonance circuit 144, and the plasma controller 146 are discussed in more detail below.

The processing volume 106 is fluidly coupled to one or more dedicated vacuum pumps, through a vacuum outlet 127, which maintain the processing volume 106 at sub-atmospheric conditions and evacuate processing, and/or other gases, therefrom. A substrate support assembly 117, disposed in the processing volume 106, is disposed on a support shaft 138 sealingly extending through the chamber base 124.

The substrate 110 is loaded into, and removed from, the processing volume 106 through an opening (not shown) in one of the one or more sidewalls 122, which is sealed with a door or a valve (not shown) during plasma processing of the substrate 110. Herein, the substrate 110 is transferred to and from a receiving surface 115 (e.g., substrate supporting surface) of a substrate support 111, which can include an ESC substrate support 111A using a lift pin system (not shown).

The substrate support 111 includes a support base 111B and the ESC substrate support 111A that is thermally coupled to, and disposed on, the support base 111B. The support base 111B is electrically isolated from the chamber base 124 by an insulator plate 111C, and a ground plate 137 that is interposed between the insulator plate 111C and the chamber base 124. Typically, the support base 111B is used to regulate the temperature of the ESC substrate support 111A, and the substrate 110 disposed on the ESC substrate support 111A, during substrate processing. In some embodiments, the support base 111B includes one or more cooling channels (not shown) disposed therein that are fluidly coupled to, and in fluid communication with, a coolant source (not shown), such as a refrigerant source or water source having relatively high electrical resistance.

In some embodiments herein, the ESC substrate support 111A further includes a biasing electrode 112 embedded in the dielectric material thereof. In one configuration, the biasing electrode 112 is a chucking pole used to secure (chuck) the substrate 110 to the receiving surface 115 of the ESC substrate support 111A and to bias the substrate 110 with respect to the plasma 107. Typically, the biasing electrode 112 is formed of one or more electrically conductive parts, such as one or more metal meshes, foils, plates, or combinations thereof. Herein, the biasing electrode 112 is electrically coupled to a high voltage module 155 which provides a chucking voltage thereto, such as static DC voltage between about −5000 V and about 5000 V, using an electrical conductor, such as the transmission line 151. Herein, a biasing electrode 112 is electrically coupled to the power generator 150 using the external conductor, such as the transmission line 151. The power generator 150 can be direct current (DC) power generator, a low frequency RF power generator or a shaped pulsed DC bias power generator.

The processing chamber 100 further includes a system controller 134. The system controller 134 herein includes a central processing unit (CPU), a memory, and support circuits. The system controller 134 is used to control the process sequence used to process the substrate 110 including the substrate biasing methods described herein. The CPU is a general purpose computer processor configured for use in an industrial setting for controlling processing chamber and sub-processors related thereto. The memory described herein may include random access memory, read only memory, floppy or hard disk drive, or other suitable forms of digital storage, local or remote. The support circuits are conventionally coupled to the CPU and comprise cache, clock circuits, input/output subsystems, power supplies, and the like, and combinations thereof. Software instructions and data can be coded and stored within the memory for instructing a processor within the CPU. A program (or computer instructions) readable by the system controller 134 determines which tasks are performable by the components in the processing chamber 100. Preferably, the program, which is readable by the system controller 134, includes code, which when executed by the processor, perform tasks relating to control the various hardware and electrical components within the processing chamber 100 to perform the various process tasks and various process sequences used to implement the electrode biasing scheme described herein.

In one embodiment, the system controller 134 controls the plasma controller 146 to direct operation of switch mode power supply 142. In another embodiment, the functionality of the plasma controller 146 may be integrated into the system controller 134.

Figure 2:
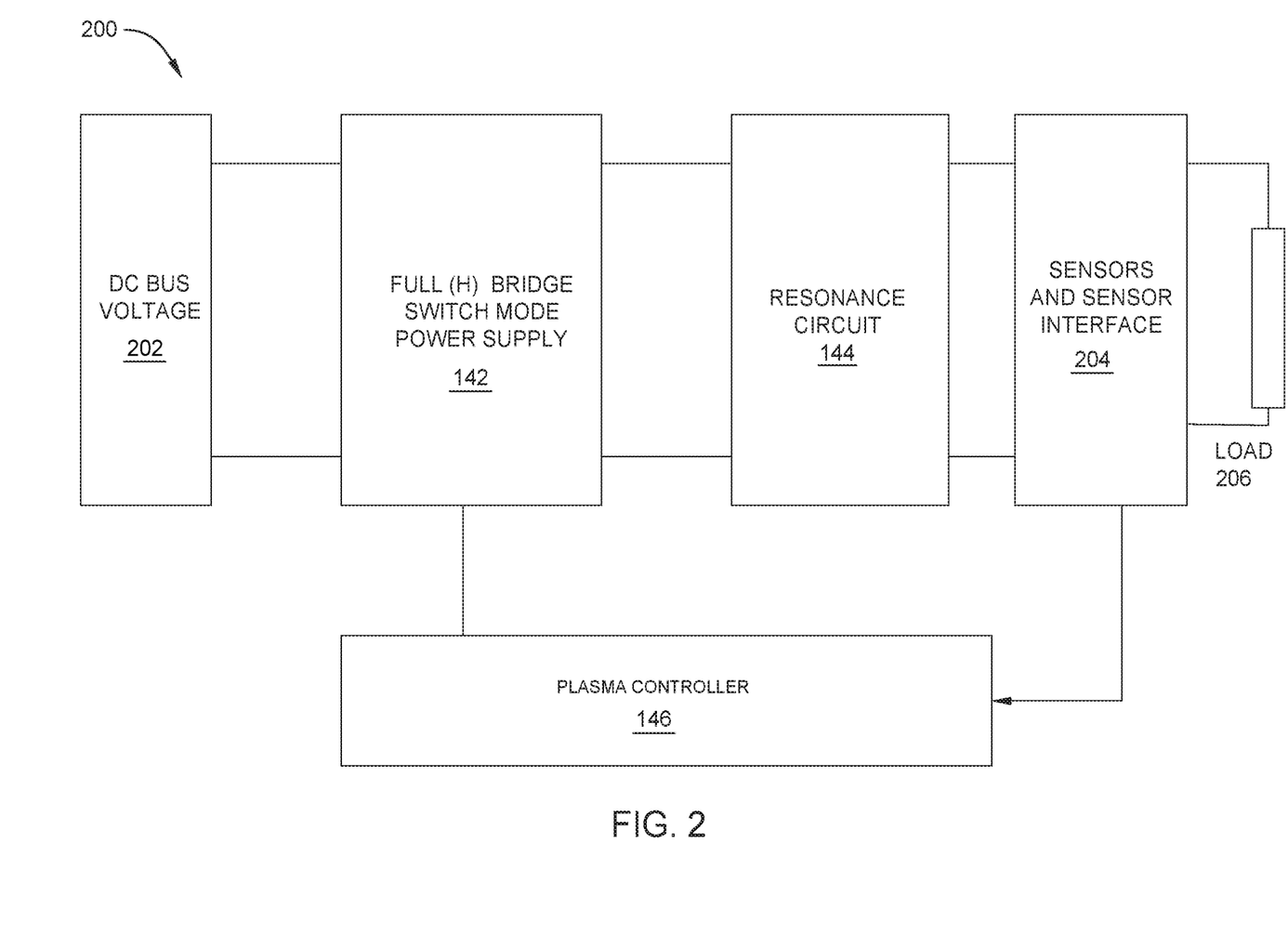
FIG. 2 is an electrical block diagram of an RF plasma generator configured to ignite and maintain a plasma from one or more processing gases in a processing chamber.

FIG. 2 is an electrical block diagram of an RF plasma generator 200 configured to ignite and maintain a plasma 107 from one or more processing gases 148 in a processing chamber 100. The RF plasma generator 200 includes the switch mode power supply 142, the resonance circuit 144, a sensor interface 204 comprising voltage and current sensors, and a plasma controller 146. The switch mode power supply 142 is configured to convert a DC voltage from a DC power source 202 to an RF voltage. In one embodiment, a voltage booster (not shown) may be employed for applying an RF voltage higher than 400 VDC. The resonance circuit 144 is configured to deliver an amount of power to an ignited plasma 107 from the switch mode power supply 142 through active frequency tuning (e.g., an algorithm related to step transition and steady state operation). In an ignition mode prior to ignition of the one or more processing gases 148 into a plasma 107, the plasma controller 146 is configured to operate the switch mode power supply 142 to apply an RF voltage corresponding to the amount of power to the one or more processing gases 148 of the load 206 through the resonance circuit 144. The RF voltage increases in amplitude and decreases in frequency that is controlled by the plasma controller 146, until the one or more processing gasses 148 of the load 206 are ignited into a plasma 107 of the load 206 (using a tuning algorithm related to open load plasma ignition). The sensor interface 204 senses the amount of power delivered to the ignited plasma 107 by employing one or more current sensors, one or more voltage sensors, and one or more phase sensors exiting the resonance circuit 144. The sensor interface 204 provides the sensed voltage, current, and phase of the load 206 to the plasma controller 146. Through these sensed parameters, the RF power delivered to the ignited plasma 107 is calculated.

The plasma controller 146 digitized the sensed RF voltage and current and reconstructs digital versions of the voltage and current waveforms. From these reconstructed waveforms, the plasma controller 146 detects ignition of the plasma 107 due to a sudden increase in current and decrease in voltage above and below threshold values, respectively, as well as a sudden shifting in phase angles between the current and the voltage, as a result of a drop in impedance of the ignited plasma 107. The RF plasma generator 200 then switches to a power delivery mode wherein the plasma controller 146 switches to a closed loop mode and continuously adjusts the frequency of the switch mode power supply 142 to apply the amount of power to the ignited plasma 107. The amount of power is a substantially constant amount of power. The plasma controller 146 compensates for a deviation of a substantially constant power (defined by a user as a set point) applied to the plasma 107 due to fluctuations in plasma impedance. An accuracy of 1% is specified after calibration.

In one embodiment, to compensate for the deviation from the constant power, the plasma controller 146 adjusts the frequency of the switch mode power supply 142 to cause the resonance circuit 144 to match the impedance of the ignited plasma 107 to maintain the plasma 107 as a resistive load. The frequency of switch mode power supply 142 changes the power in the plasma to a (maximum) constant power (defined by the user as a power set point) approximately equal to the power output by the switch mode power supply 142. The plasma controller 146 compensates for a deviation of delivered power from the constant power set point based on an average delivered power calculation. In an embodiment, the switch mode power supply 142 is configured to provide sufficiently high current, up to 95 Amps, to the resonance circuit 144, and together they can generate an output voltage for plasma ignition higher than 4 kV peak-to-peak to an open load.

Figure 3A:
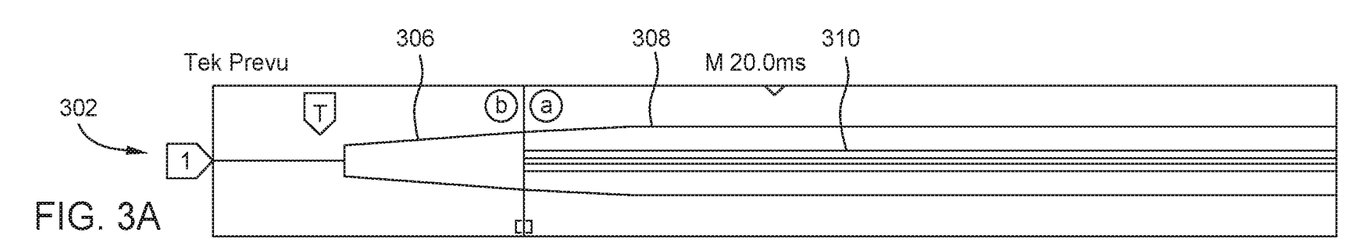
FIGS. 3A and 3B are graphs of voltage and current over time for power applied by the RF plasma generator to the load.
Figure 3B:
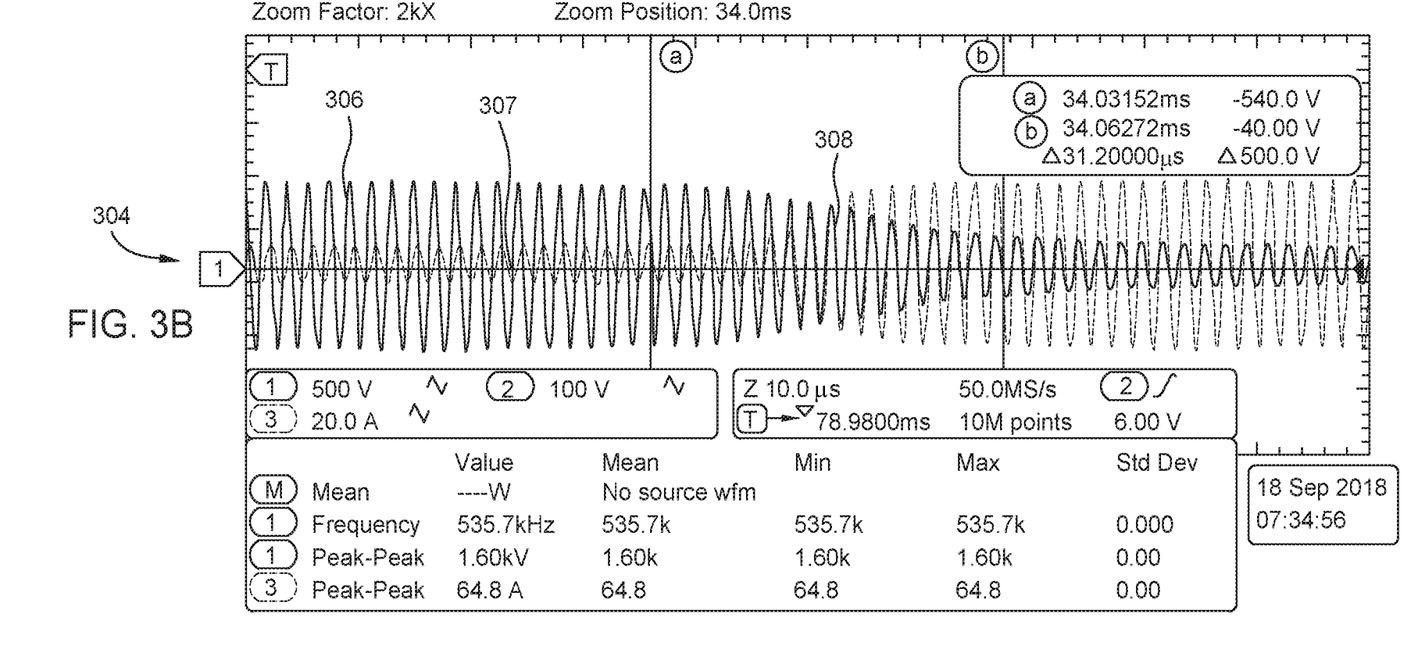

FIGS. 3A and 3B are graphs of voltage and current over time for power applied by the RF plasma generator 200 to the load 206. FIG. 3A shows a graph 302 of applied voltage and current applied over a condensed time scale, while FIG. 3B shows a graph 304 of applied current and voltage over a short time scale in a vicinity of ignition of the plasma. In the plasma ignition mode, applied voltage 306 ramps up from a low value to a value that ignites the plasma 107, while little or no current 307 flows in the load 206. Upon ignition, a large current 308 flows in the load 206 and voltage 310 drops across the load 206. The time scale of the graph of FIG. 3B does not indicate an accompanying decrease in frequency of the applied voltage 306, 310. After plasma ignition, the RF plasma generator 200 switches to a constant power delivery mode. In the constant power delivery mode, the applied voltage 310 and resulting current 308 are continuously adjusted to maintain a constant power applied to the ignited plasma 107.

Figure 4:
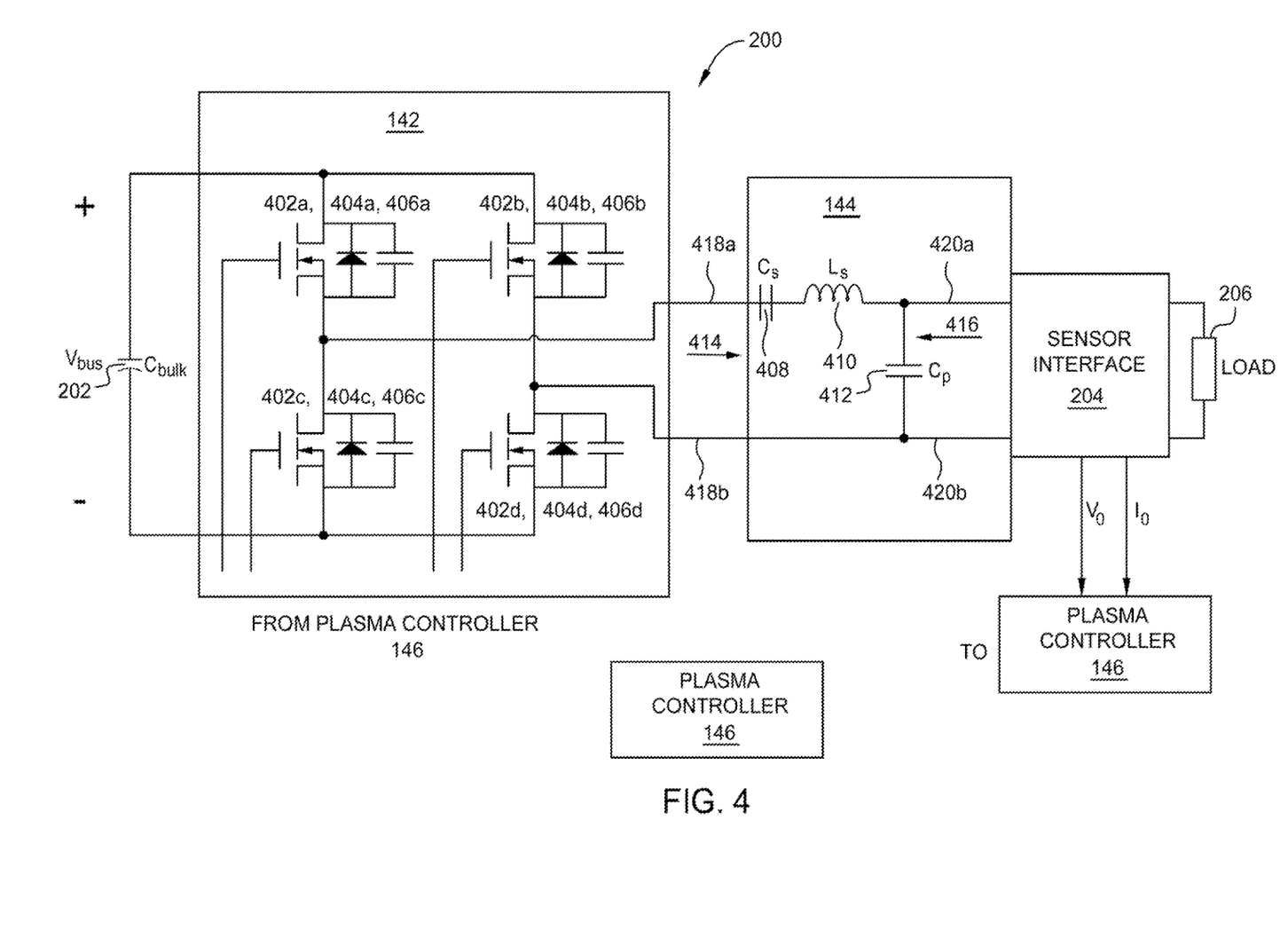
FIG. 4 shows an electrical circuit diagram of the switch mode power supply and the resonance circuit under the control of the plasma controller

FIG. 4 shows an electrical circuit diagram of the switch mode power supply 142 and the resonance circuit 144 under the control of the plasma controller 146. The switch mode power supply 142 is a full bridge (H-bridge) switching power supply 142 that is powered by a DC power source 202 after a rectifier and booster (not shown). The H-bridge switching power supply 142 includes a block of four Field Effect Transistor (FET) switches 402a-402d. The drain-gate outputs of each of the FETs 402a-402d are protected from high voltage transients generated during switching by corresponding parallel reversed-biased diodes 404a-404d and capacitors 406a-406d. The gates of each of the FETs 402a-402d are coupled to and controlled by signal processing circuitry (to be discussed below in connection with FIG. 8) within the plasma controller 146. The plasma controller 146 generates a train of voltage pulses to the gates of the FETs 402a-402b to cause the FETs 402a-402d to switch in such a manner to synthesize an RF voltage waveform of variable frequency. The RF voltage waveform is applied to the resonance circuit 144.

The plasma controller 146 performs three separate functions. First, the plasma controller 146 controls the frequency of the H-bridge switching power supply 142 so that it is compatible with the power requirement of the plasma load 206. Second, the plasma controller 146 controls the relative timing (signal phase) of signals applied to the gates of the H-Bridge FET's 402a-402d so that the switching occurs at the desired time. Third, the plasma controller 146 controls the duty cycle of the signals applied the gates of the FET's 402a-402d in order to minimize power dissipation and transients which would harm the devices.

The resonance circuit 144 is an LCC resonant tank. The resonance circuit 144 has an input port 414 connected to the switch mode power supply 142 and an output port 416 configured to be connected to the load 206 through a sensor interface 204. Each of the input port 414 and the output port having 416 first terminals 418a, 418b and second terminals 420a, 420b. The resonance circuit 144 has a first capacitor Cs (408) connected to the first terminal 418a of the input port 414 and to an inductor Ls (410) connected in series with the first capacitor Cs (408) to the first terminal 420a of the output port 416. The resonance circuit 144 further comprises a second capacitor Cp (412) connected between the first terminal 420a of the output port 416 and the second terminal 420b of the output port 416.

A current transducer (not shown) is also placed between the first terminal 418a and the first terminal 420a of the output port 416 before the second capacitor Cp (412). After exiting the resonance circuit 144, a current transducer (not shown) is placed between the first terminal 420a of the output port 416 and the load 406 as an output for the resonance circuit 144 within the sensor interface 204. A voltage sensor (not shown) is also placed between the first terminal 420a and second terminal 420b of the output port 420 within the sensor interface 204. Analog signals proportional to the sensed voltage Vo and the sensed currents Io are provided by the sensor interface 204 to the plasma controller 146. The sensor interface 204 is coupled to the load 206 (one or more processing gases 148 or ignited plasma 107).

Figure 5:
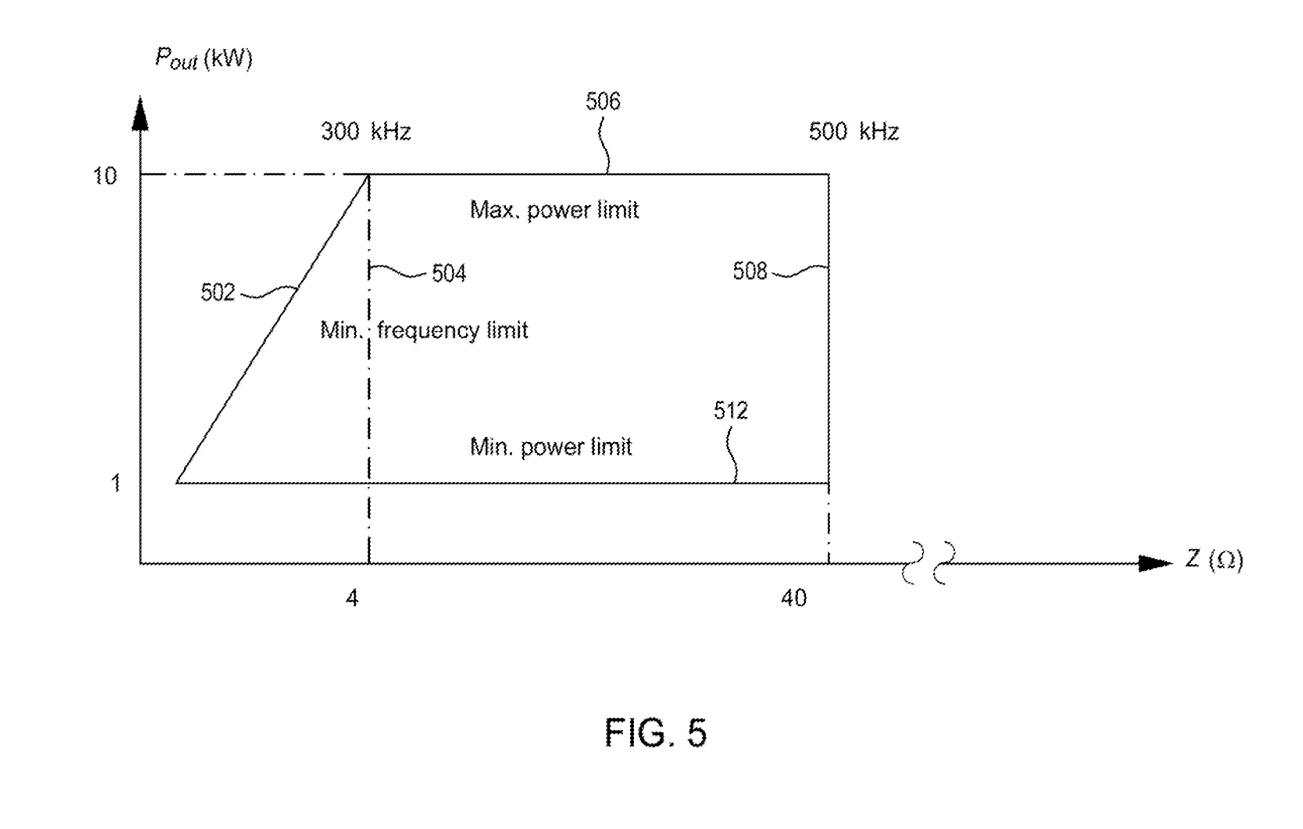
FIG. 5 is a graph of power vs. impedance applied to the load by the RF plasma generator of FIG. 2.

FIG. 5 is a graph of power vs. impedance applied to the load 206 by the RF plasma generator 200 of FIG. 2. Power specified by plasma load range for a load 206 between 4 and 40 ohms is illustrated. A plot of an operating envelope discloses that power, in kW proceeds from a minimum power limit 512 to a maximum power limit 506. Additionally, minimum and maximum frequency limits 504, 508, respectively, are provided as ending values for the graph.

During plasma ignition operations, aspects of the disclosure enable partial power delivery of power 502 with large phase angle between the applied current 307 and the applied voltage 306. In this phase, the plasma controller 146 does not check or regulate output power. Instead, the plasma controller 146 ramps down frequency while ramping up output voltage. The plasma controller 146 can sustain a plasma field at the same frequency of ignition. This is useful feature that hastens the arrival of the plasma field to a steady state more smoothly and quickly. The resonance circuit 144 outputs high voltage as a frequency and the Q-value of the circuit. The plasma controller 146 can actively control the switch mode power supply 142 in order to elevate the applied voltage 306 to a desired level.

In the resonance circuit 144, capacitor Cs (406), capacitor Cp (412), and inductor Ls (410) are selected in connection with an expected plasma load impedance to enable full power delivery for a dedicated load impedance range. In one embodiment, for a resistive load 206 full constant power 506 can be delivered between 300 kHz (504) and 500 kHz (508), for a load range between 4 and 40 Ohms. If applied power is below or beyond the frequency range 504, 508, power will be partially delivered to the load 206.

Figure 6:
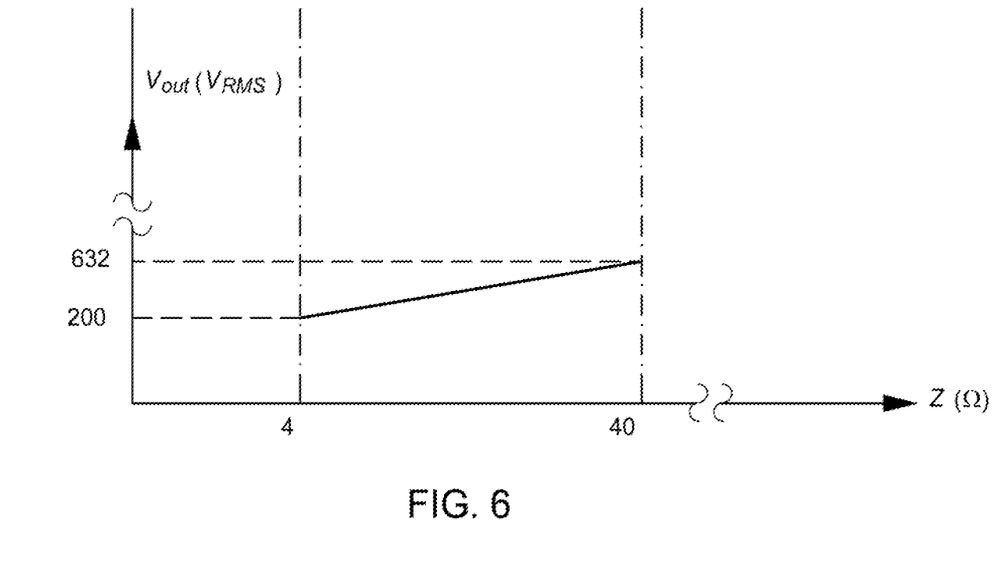
FIG. 6 is a graph of voltage (top graph) and current (bottom graph) vs. impedance (in ohms) for an ignited plasma load.

FIG. 6 is a graph of voltage and current vs. impedance (in ohms) for an ignited plasma load 206. In the top portion of the graph, a straight line relationship is provided from a minimum value of 200 V to a maximum value of 632 V for a plasma load impedance between 4 ohms and 40 ohms. Over this same impedance range, the current value decreases from a value of 51.2 Amps to a value of 43.5 Amps. The straight line of FIG. 6 indicates that the ignited plasma load 206 behaves resistively.

Figure 7:
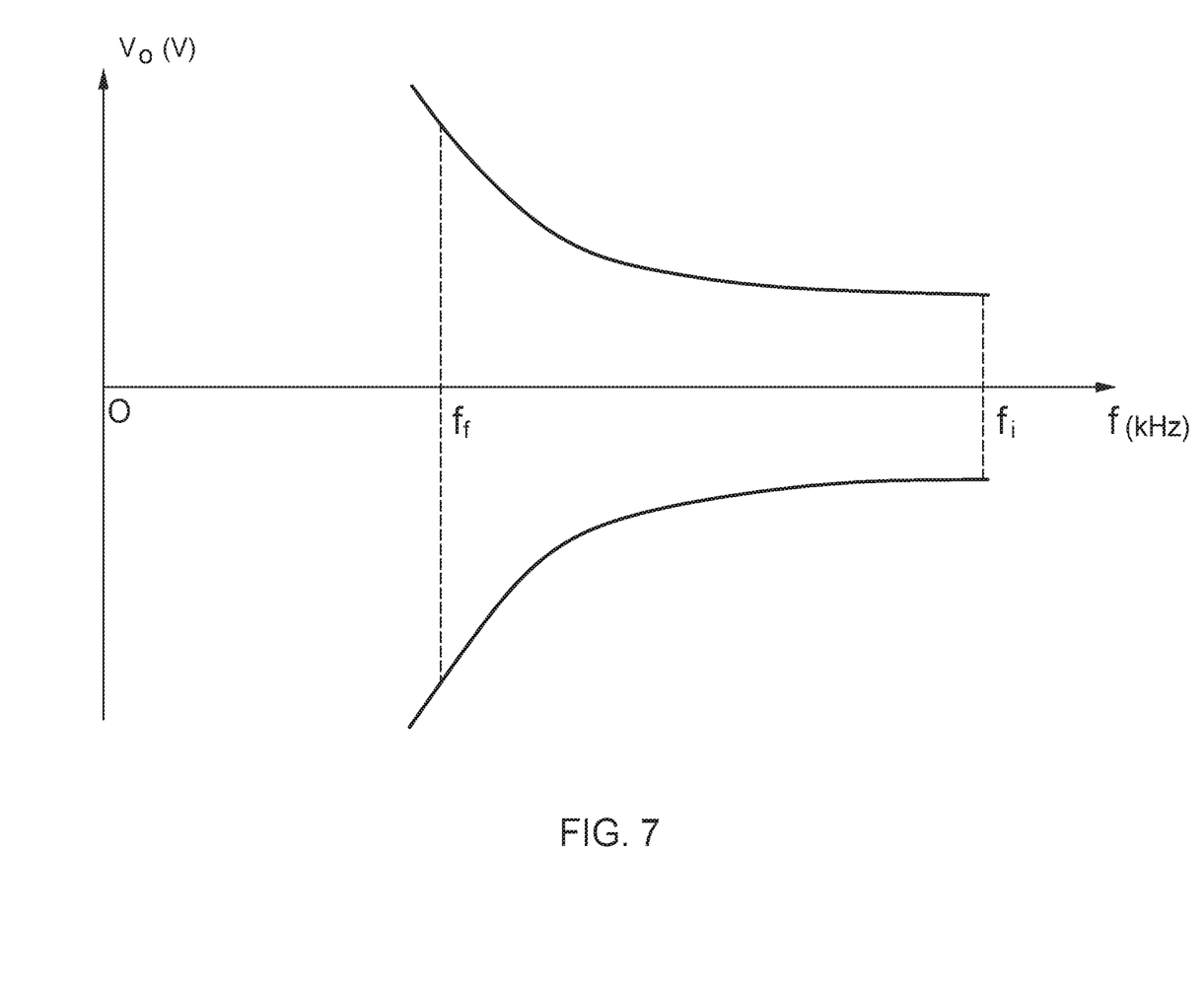
FIG. 7 is a graph a voltage vs frequency for voltage applied to the load during the ignition phase by the switch mode power supply of FIG. 2.

FIG. 7 is a graph a voltage vs frequency for voltage applied to the load 206 during the ignition phase by the switch mode power supply 142 of FIG. 2. As illustrated, except for very low levels of frequency, the switch mode power supply 142 operates between an ignition low frequency ff and an initial high frequency fi. The resonance circuit 144 is able to ignite the plasma 107 and the RF plasma generator 200 provides sufficient output and Q-value in the resonance circuit 144, as well as the proper voltage and current ratings. Such capabilities are beneficial to plasma ignition in an inductively coupled plasma discharge. When the number of parallel current paths increases in an ICP antenna system, or the inductively coupled plasma discharge's parallel magnetic flux link numbers increase, however, aspects of the disclosure are able to use a stand-alone ignition circuit to assist in these functions. For synchronization or phase-in operation, the assisting voltage can source directly from the power output waveform or can go through an auxiliary source.

Figure 8:
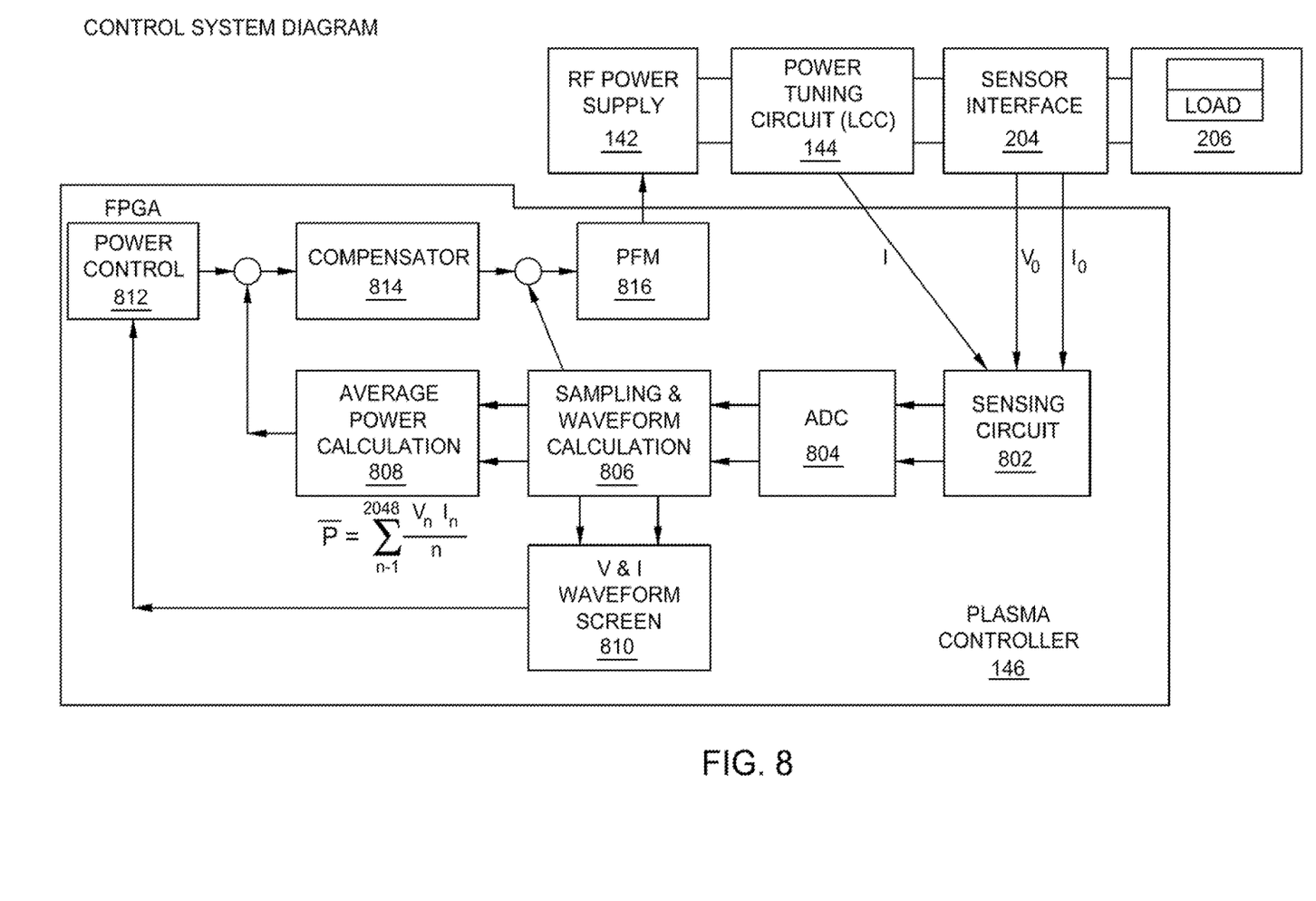
FIG. 8 shows an electrical circuit block diagram of the plasma controller.

FIG. 8 shows an electrical circuit block diagram of the plasma controller 146. The plasma controller 146 comprises a sensor circuit processing module 802, an analog-to-digital converter 804, a sampling and waveform calculation module 806, an average power calculation module 808, a voltage and current waveform screen module 810, a power control module 812, a compensator module 814, and a pulse-frequency modulation module (PFM) 816, interconnected as shown. The sensor processing module 802 is configured to sample analog voltage and currents output by the sensors (not shown) of the sensor interface 204. The resulting analog voltage and currents are digitized by the analog-to-digital converter 804. The sampling and waveform calculation module 806 receives the digitized voltage add current signals from the A/D converter and digitally samples these signals beyond the Nyquist rate in order to permit full digital reconstruction of the voltage (V) and current (I) waveforms. The average power calculation module 808 calculates the sums actual power of the reconstructed voltage and current waveforms for multiple sampling points within a period, i.e., integrate V*I over a period approximated with a summation $$\left(\overline{P} = \Sigma_{n=1}^{2048} \frac{V_n \, L_n}{n}\right).$$

The voltage and current waveform screen module 810 monitors the reconstructed voltage (V) and current (I) waveforms and detects any fast or abrupt change that is related to an arc event, e.g., an abrupt voltage drop in peak voltage. The power control module 812 compared the calculated average power or the output of 808 is used to compare with power set point (of constant power). The compensator module 814 compares real power (V*I) calculated by the power control module 812 or average power calculated 808 with the power set point received from the power control module 812 and then compensates for a power difference.

This power difference is translated by the pulse-frequency modulation module (PFM) 816 to control a pulse train having a duty cycle that in turn controls the RF output of the RF power supply 142. The PFM 816 uses pulsing with a certain frequency that is solely to determine how much power is allowed to go to the later RF power supply 142 (switch mode power supply 142). The PFM 816 functions as a knob used to adjust power and thus achieve power closed loop control. Usually the pulsing frequency in PFM 816 is much lower than the real output RF frequency output by the switch mode power supply 142. The real output RF frequency is generated in a later section called "full bridge RF switching module" of the switch mode power supply 142. Pulsing frequency in PFM 816 can be around a few kilohertz, but the output RF frequency of the switch mode power supply 142 is around a few hundred kilohertz.

The PFM 816 performs three separate functions. First, the PFM 816 controls the frequency of the H-Bridge in the switch mode power supply 142 so that it is compatible with the frequency of the plasma load. Second, the PFM 816 controls the relative timing (signal phase) of signals applied to the gates of the H-Bridge MOSFET's so that the switching occurs at the desired time. Third, the PFM 816 controls the duty cycle of the signals applied the gates of the MOSFETs in order to minimize power dissipation and transients which would harm the devices.

The PFM 816 is used to control power. The DC power set in the switch mode power supply 142 can be segmented and controlled, as P=V*I*duty cycle. If duty cycle=100% that represents a maximum power. If duty cycle=50%, then the output becomes half. So by controlling the duty cycle, one can control the power output of the switch mode power supply 142.

In open-loop operation, the power control module 812 controls the applied frequency according a preset sequence of commands, and tunes the applied frequency through the PFM 816 and the switch mode power supply 142 from an initial high value (e.g., 580 KHz) down to a lower value (e.g. 530 kHz) with an algorithm that defines time length (e.g., ~10-50 milliseconds) and frequency step, and ramps output voltage up (e.g., to equal or larger than 2 kilovolts peak) until the plasma 107 is ignited.

To detect ignition of the plasma, the sensor interface 204 monitors load voltage and current. The sensed load voltage and current are sensed, digitally processed, and their respective waveforms are reconstructed by 802, 804 and 806. Upon plasma ignition, the voltage will drop from its igniting point to, e.g. 200 Vpeak, current increases to, e.g. >30 A RMS, and the load impedance drop to, e.g., a few ohms in magnitude as determined by exceeding/going below threshold values set in the power control module 812. The power control module 812 then switches into closed loop constant power mode and run a preset algorithm to tune the power to its set point (a pre-determined constant power output).

In another embodiment, plasma ignition can be detected in other ways. When the re-constructed voltage and current show a significant drop and increase, respectively, and a phase angle between V and I drops from 90 degree to, e.g., 40 degree, as determined by the power control module 812, this is interpreted by the power control module 812 to mean that real power is being delivered into the load. Accordingly, the power control module 812 then ends the ignition sensing step and enters the closed loop mode of operation in which frequency of the switch mode power supply 142 is varied to tune the RF plasma generator 200 to a best operation constant power point. In another embodiment, ignition may be detected by only voltage, only current, only phase angle, current+voltage, current+phase, and voltage+phase, or current, voltage, and phase together. The more factors in combination, the more reliable the detection.

In closed-loop operation, the sensor processing module 802 samples analog voltage and currents output by the sensors (not shown) of the sensor interface 204. The analog voltage and currents are digitized by the analog-to-digital (A/D) converter 804. An analog filter (not shown) is applied on the input to the A/D converter 804 to exclude of switching noise of the switch mode power supply 142. The sampling and waveform calculation module 806 receives the digitized voltage and current signals from the A/D converter 804 and digitally samples these signal beyond the Nyquist rate in order to permit full digital reconstruction of the voltage (V) and current (I) waveforms. The average power calculation circuit 808 calculates an average power of the reconstructed waveforms, V and I, from the sampling and waveform calculation module 806. The digital signals for V and I are reconstructed with the aid of a calibration look up table. A digital filter (not shown) is then applied to correct distortions introduced by noise due to switching of the switch mode power supply 142.

The calculated average power of 808 is compared with a power set point stored in the power control module 812. The compensator module 814 determine if the output power needs compensation and in which direction to compensate. The compensator module 814 feeds the compensation power to the PFM 816, which adjusts output duty cycle to the switch mode power supply 142 to adjust output frequency to the resonance circuit 144 to feed into sensor interface 204 just before the plasma 107, thereby completing real time RF power closed loop control.

In an embodiment, the power control module 812 calculates delivered power with a calibration table having a 1% accuracy. Phase information can be obtained as well as load impedance. From the reconstructed waveforms, the power control module 812 determines waveform characteristics as well as an estimated load impedance of the plasma 107. In one embodiment, rather than re-calculating waveform characteristics, the average power calculation module 808 is employed to calculate the real average power according to the formula $$\left(\overline{P} = \Sigma_{n=1}^{2048} \frac{V_n \, L_n}{n}\right),$$

and this quantity is used by the power control module 812 to compare to the set point. In another embodiment, the power control module 812 re-calculates waveform characteristics based on the resonance circuit Q value to obtain a new amplitude and phase of a power supply waveform to maximize power delivery to the plasma 107. This information is fed to the compensator module 814 and the PFM 816 to adjust the frequency of the switch mode power supply 142 to obtain constant power output to the plasma 107.

The digital waveform reconstruction and sampling also enable monitoring for abrupt changes in V and I from period to period, and a threshold is set for a variation toleration. Exceeding the toleration threshold is indicative of an arcing event. When an arcing event is detected, a warning is sent to the power control module 812 to stop the power delivery process. To detect plasma arcing, the power control module 812 detects an over current event or under voltage event in real time. the over current event or under voltage event occurs when the ignited plasma current exceeds an arcing threshold current, or output voltage drop falls below an arcing threshold level. Digital data processing and waveform reconstruction enable the fastest arcing detection. An arc event can be sensed within an RF period and the power control module 812 can stop power delivery within the same time scale.

While embodiments have been described herein, those skilled in the art, having benefit of this disclosure will appreciate that other embodiments are envisioned that do not depart from the inventive scope of the present application. Accordingly, the scope of the present claims or any subsequent related claims shall not be unduly limited by the description of the embodiments described herein.

What is claimed is:

1. An RF plasma generator configured to ignite and maintain a plasma from one or more processing gases, comprising:
   a switch mode power supply configured to convert a DC voltage from a DC power source to an RF voltage;
   a resonance circuit configured to deliver an amount of power to an ignited plasma from the switch mode power supply; and
   a plasma controller comprising a sensing circuit processing module coupled to the resonance circuit, an analog-to-digital converter (ADC), a sampling and waveform calculation (SWC) module, a waveform screen, and a pulse frequency modulation module, wherein the plasma controller is configured to:
   receive, with the sensing circuit, an analog voltage measurement at the sensing circuit;
   convert, with the ADC, the analog voltage measurement to a digitized voltage measurement;
   detect, with the waveform screen, a waveform of the digitized voltage measurement to generate a real power value;
   modify, responsive to detecting a waveform indicating a real power under voltage event, a real power signal to indicate the real power under voltage event;
   sample, with the SWC module, the digitized voltage measurement;
   generate an average power value based on the sampled digitized voltage measurement;
   compare the real power value to the average power value; and
   generate a control signal for controlling the switch mode power supply with the pulse frequency module, comprising a difference between the average power value and the real power value; and
   stop, responsive to the waveform screen detecting a real power under voltage event, power delivery via the control signal.

2. The RF plasma generator of claim 1, further comprising a plurality of sensors coupled to the resonance circuit for sensing the amount of power delivered to the ignited plasma.

3. The RF plasma generator of claim 2, wherein the plasma controller is configured to detect ignition of the plasma in response to the plurality of sensors sensing a decrease in applied voltage and an increase in applied current exiting the resonance circuit.

4. The RF plasma generator of claim 1, wherein, responsive to detecting ignition of the plasma, the plasma controller is further configured to continuously adjust the frequency of the switch mode power supply to deliver the amount of power to the ignited plasma, wherein the amount of power is a substantially constant amount of power.

5. The RF plasma generator of claim 4, wherein the resonance circuit is configured to deliver the substantially constant amount of power to the ignited plasma over a range of plasma impedances between about 4 and about 40 ohms for full power delivery and to deliver partial power for plasma impedances less than 4 ohms or greater than 40 ohms.

6. The RF plasma generator of claim 4, wherein the substantially constant amount of power deliverable to the ignited plasma is equal to the power deliverable by the switch mode power supply.

7. The RF plasma generator of claim 4, wherein the plasma controller compensates for a deviation of delivered power from the substantially constant amount of power based on an average delivered power calculation.

8. The RF plasma generator of claim 4, wherein the resonance circuit is configured to deliver the substantially constant amount of power up to a full power rating of 10 kW, to the ignited plasma over a range of frequencies of voltage applied to the ignited plasma between 300 kHz and 500 kHz.

9. The RF plasma generator of claim 4, wherein the plasma controller continuously adjusts the frequency of the switch mode power supply to compensate for deviations from the constant amount of power delivered to the ignited plasma due to fluctuations in ignited plasma impedance.

10. The RF plasma generator of claim 9, wherein adjusting the frequency of the switch mode power supply causes the resonance circuit to match the impedance of the ignited plasma.

11. The RF plasma generator of claim 1, wherein the switch mode power supply is a full (H) bridge switch mode power supply.

12. The RF plasma generator of claim 1, wherein the resonance circuit is an LCC resonant tank.

13. The RF plasma generator of claim 1, wherein the resonance circuit has an input port connected to the switch mode power supply and an output port configured to be connected to the ignited plasma, each of the input port and the output port having first and second terminals, wherein the resonance circuit has a first capacitor connected to the first terminal of the input port and an inductor connected in series with the first capacitor to the first terminal of the output port, and wherein the resonance circuit further comprises a second capacitor connected between the first terminal of the output port and the second terminal of the output port.

14. A processing chamber, comprising:
   a chamber body having an internal volume;
   a gas inlet disposed through the chamber body used to provide one or more processing gases to the internal volume from a processing gas source in fluid communication therewith; and an RF plasma generator configured to ignite and maintain a processing plasma from the one or more processing gases, the RF plasma generator comprising:
  a switch mode power supply configured to convert a DC voltage from a DC power source to an RF voltage;
  a resonance circuit configured to deliver an amount of power to an ignited plasma from the switch mode power supply; and
a plasma controller comprising a sensing circuit processing module coupled to the resonance circuit, an analog-to-digital converter (ADC), a sampling and waveform calculation (SWC) module, a waveform screen, and a pulse frequency modulation module, wherein the plasma controller is configured to:
  receive, with the sensing circuit, an analog voltage measurement at the sensing circuit;
  convert, with ADC, the analog voltage measurement to a digitized voltage measurement;
  detect, with the waveform screen, a waveform of the digitized voltage measurement to generate a real power value, and responsive to detecting a waveform indicating a real power under voltage event, modify a real power signal to indicate the real power under voltage event;
  sample, with the SWC module, the digitized voltage measurement;
  generate an average power value based on the sampled digitized voltage measurement;
  compare the real power value to the average power value; and
  generate a control signal for controlling the switch mode power supply with the pulse frequency module, comprising a difference between the average power value and the real power value, and responsive to the waveform screen detecting a real power under voltage event, stop power delivery via the control signal.

15. The processing chamber of claim 14, further comprising a plurality of sensors coupled to the resonance circuit for sensing the amount of power delivered to the ignited plasma.

16. A method for operating an RF plasma generator configured to ignite and maintain a processing plasma from one or more processing gases, comprising:
  converting, by a switch mode power supply, a DC voltage from a DC power source to an RF voltage;
  delivering, by a resonance circuit, an amount of power to an ignited plasma from the switch mode power supply; and
  receiving, with a sensing circuit of a switch mode power supply, an analog voltage measurement at the sensing circuit;
  converting, with an analog-digital converter (ADC) of the switch mode power supply, the analog voltage measurement to a digitized voltage measurement;
  detecting, with a waveform screen of the switch mode power supply, a waveform of the digitized voltage measurement to generate a real power value;
  modifying, responsive to detecting a waveform indicating a real power under voltage event, a real power signal to indicate the real power under voltage event;
  sampling, with a sampling and waveform calculation (SWC) module, the digitized voltage measurement;
  generating an average power value based on the sampled digitized voltage measurement;
  comparing the real power value to the average power value;
  generating a control signal for controlling the switch mode power supply with a pulse frequency module of the switch mode power supply, comprising a difference between the average power value and the real power value; and
  operating the switch mode power supply with the control signal, by a plasma controller, to apply an RF voltage to the one or more processing gases through the resonance circuit, wherein the RF voltage increases in amplitude and decreases in frequency until the one or more processing gasses is ignited into a plasma.

17. The method of claim 16, further comprising detecting ignition of the plasma, by the plasma controller, in response to sensing a decrease in applied voltage and an increase in applied current exiting the resonance circuit.

18. The method of claim 16, wherein, responsive to detecting ignition of the plasma, the plasma controller is further configured to continuously adjust the frequency of the switch mode power supply to deliver the amount of power to the ignited plasma, wherein the amount of power is a substantially constant amount of power.

19. The method of claim 16, further comprising detecting an over current event in real time to monitor for plasma arcing.

20. The method of claim 19, wherein the over current event occurs when the ignited plasma current exceed an arcing threshold current.

* * * * *